United States Patent [19]

Eichelberger et al.

[11] Patent Number: 4,937,203
[45] Date of Patent: Jun. 26, 1990

[54] METHOD AND CONFIGURATION FOR TESTING ELECTRONIC CIRCUITS AND INTEGRATED CIRCUIT CHIPS USING A REMOVABLE OVERLAY LAYER

[75] Inventors: Charles W. Eichelberger, Schenectady; Robert J. Wojnarowski, Ballston Lake; Kenneth B. Welles, II, Schenectady, all of N.Y.

[73] Assignee: General Electric Company, Schenectady, N.Y.

[21] Appl. No.: 414,895

[22] Filed: Sep. 29, 1989

Related U.S. Application Data

[60] Division of Ser. No. 230,654, Aug. 5, 1988, Pat. No. 4,884,122, which is a continuation of Ser. No. 912,454, Sep. 26, 1986, abandoned.

[51] Int. Cl.$^5$ .................. H01L 21/66; H01L 21/70
[52] U.S. Cl. ............................... 437/51; 437/8; 437/209; 437/211
[58] Field of Search .................. 437/51, 209, 211, 8, 437/228; 324/158 R; 357/72, 75

[56] References Cited

U.S. PATENT DOCUMENTS

| | | | |
|---|---|---|---|
| 3,290,756 | 12/1966 | Dreyer | 29/155.5 |
| 3,614,832 | 10/1971 | Chance et al. | 29/626 |
| 3,679,941 | 7/1972 | LaCombe et al. | 317/101 A |
| 3,691,628 | 9/1972 | Kim et al. | 29/577 |
| 3,702,025 | 11/1972 | Archer | 437/51 |
| 3,746,973 | 7/1973 | McMahon, Jr. | 324/51 |
| 3,757,175 | 9/1973 | Kim et al. | 317/234 R |
| 3,795,045 | 3/1974 | Dumas | 437/51 |
| 3,795,975 | 3/1974 | Calhoun et al. | 437/51 |
| 3,803,483 | 4/1974 | McMahon, Jr. | 324/51 |
| 3,835,530 | 9/1974 | Kilby | 437/51 |
| 4,246,595 | 1/1981 | Noyori et al. | 357/70 |
| 4,300,153 | 11/1981 | Hayakawa et al. | 357/80 |
| 4,347,306 | 8/1982 | Takeda et al. | 427/96 |
| 4,417,393 | 11/1983 | Becker | 29/846 |
| 4,426,773 | 1/1984 | Hargis | 29/382 |
| 4,588,468 | 5/1986 | McGinty et al. | 156/345 |
| 4,613,891 | 9/1986 | Ng et al. | 357/68 |
| 4,617,085 | 10/1986 | Cole et al. | 156/643 |
| 4,677,528 | 6/1987 | Miniet | 361/398 |
| 4,721,995 | 1/1988 | Tanizawa | 357/80 |
| 4,783,695 | 11/1988 | Eichelberger et al. | 357/68 |

FOREIGN PATENT DOCUMENTS

| | | |
|---|---|---|
| 0010657 | 10/1979 | European Pat. Off. |
| 0175870 | 12/1981 | European Pat. Off. |
| 0111128 | 12/1983 | European Pat. Off. |
| 0178227 | 10/1985 | European Pat. Off. |
| 0228694 | 12/1986 | European Pat. Off. |

OTHER PUBLICATIONS

Jubb, Charles, "PC Board Layout Via AutoCAD", Cadence, vol. 1, No. 2, pp. 51–55.

Angell, Richard, "End-to-End Design", PC Tech. Journal, vol. 4, No. 11, Nov. 1986, pp. 97–119.

Clark, R. J. and Nakagawa, T., "The STD Process—New Developments and Applications", Abstract from the 1974 Microelectronics Symposium held Oct. 1974, pp. 131–144.

IBM Technical Disclosure Bulletin, vol. 28, No. 5, Oct.
(List continued on next page.)

Primary Examiner—Brian E. Hearn
Assistant Examiner—Tom Thomas
Attorney, Agent, or Firm—Robert Ochis; James C. Davis, Jr.; Marvin Snyder

[57] ABSTRACT

The utilization of a removable overlay layer together with its associated metallization pattern, is used to effectively provide wafer scale integration for integrated circuit chips. The method and configuration of the present invention provide for the fabrication and testing of systems which are otherwise untestable. The present invention also permits integrated circuit systems to be tested in their final configuration in terms of speed and operating environment and the invention eliminates many of the problems associated with wafer or chip probes. The present invention also utilizes special test chips which are either temporarily or permanently affixed in an integrated circuit chip package.

14 Claims, 7 Drawing Sheets

OTHER PUBLICATIONS

1985, "Lift-Off Stencil Created by Laser Ablation", p. 2034.

Egitto, F. D. et al., "Plasma Etching of Organic Materials. I. Polyimides in $O_2$–$CF_4$", *Journal of Vacuum Science & Technology*/B3, (1985), May–Jun., No. 3, pp. 893–904.

Auletta, L. V. et al., "Flexible Tape Conductor Interconnection for Chips", *IBM Technical Disclosure Bulletin*, vol. 24, No. 2, Jul. 1981, pp. 1214–1215.

*High Technology*, Oct. 1986, p. 55.

"Embedding ICs in Plastic Cuts Interconnect Space", *Electronics*, Jun. 9, 1986, pp. 17 and 20.

Hennpenheimer, T. A., "Monster Chips", *Popular Science*, pp. 104, 106, 108 and 110.

Lukaszek, W. et al., "CMOS Test Chip Design for Process Problem Debugging and Yield Prediction Experiments", *Solid State Technology*, Mar. 1986, pp. 87–93.

METHOD AND CONFIGURATION FOR TESTING ELECTRONIC CIRCUITS AND INTEGRATED CIRCUIT CHIPS USING A REMOVABLE OVERLAY LAYER

This application is a division of application Ser. No. 230,654, filed Aug. 5, 1988, now U.S. Pat. No. 4,884,122 as a continuation of application Ser. No. 912,254, filed Sept. 26, 1986, abandoned.

BACKGROUND OF THE INVENTION

The present invention relates to packaging electronic integrated circuit chips into operable chip systems in a manner to facilitate testability. More particularly, the present invention relates to a method and configuration employing one or more removable overlay layers containing interconnection metallization patterns. Even more particularly, in one embodiment of the present invention, test chips are packaged with the system chips to exercise the system in its final configuration.

The present invention is generally directed to a method for interconnecting integrated circuit chips so as to allow them to be tested in their final configuration in terms of speed, operating environment packaging, temperature, voltage and proximity to other chips of the system. In the present invention, a removable overlay layer is applied to chips positioned on a substrate. The interconnection pattern of the overlay layer is specifically designed to partition the system for easy testing. The interconnect density of the overlay structure and its very low capacitive loading permit the utilization of extremely high density patterns which can make interconnection to a chip possible, otherwise, chip systems cannot easily be tested. Probe stations are inadequate for such purposes because too many probes would be required or because the chip pads are too small to accommodate a probe or because the capacitive loading of the probe station is too high to allow the chip to operate at maximum speed.

Special test chips may also be employed herein. These test chips are placed on the substrate along with the operating chip or chip system for the purpose of testing circuits at speeds and under operating conditions which cannot be duplicated at the wafer probe level.

The overlay layer employed herein is removable and there is no resulting degradation to the underlying chip. The overlay layer can be removed and reapplied several times if necessary with different wiring configurations and with removal and replacement of defective chips until the final operating configuration is established. Alternate overlay configurations are possible. In one configuration, inferior, but easily processed materials are used to provide a test overlay layer thereby simplifying the process and exposing the chips to less stringent processing conditions. In a second configuration, a test overlay layer is applied over an already in place overlay layer for the purpose of simplifying partitioning and multiprobe testing of a complex system.

The method and configuration of the present invention is unique in that chips can be arranged in their final operating positions, and connected for the purpose of testing. Then all connections are removed and are reconnected in an operating configuration. Other interconnect systems, including hybrid circuits, printed circuits and hard-wiring are not amenable to easy removal of all interconnects and reapplication of the interconnections in a different form.

The problem to be solved is a multi-faceted one. The generic problem is to test a system at the lowest feasible functional level to identify defective parts so that a completely functioning system with a high degree of assured reliability can be produced. A first set of problems results from the deficiency of probing chips at the wafer level. Wafer probers are limited in speed of the chips that they can test due to the relatively long runs and high capacitive loading associated with the probes. Wafer probes are also limited in the total number of chip pads which can be probed at one time. Wafer probes are also limited by the minimum size of the pad which can be probed. This limitation is exacerbated by large numbers of pads. Additionally, increased pin count is also becoming more prevalent with the advent of very large scale integration since more complexity can now be put on a given chip.

Another problem exists in testing systems where several chips must be interconnected to perform a given function. In particular, it may be impossible to detect a defective part until it is interconnected with other parts of the functional block. Examples of such cases include multiple chip microprocessor systems, fast fourier transform systems in which the system size is too large for a single chip, large parallel multiplying systems, and memory systems. It is possible to test the functional blocks after they are assembled into a complete system. However, testing would then be extremely complex and time consuming due to the constraints imposed by the large number of parameters which must be tested.

An additional problem is testing chips under burn-in conditions. The typical burn-in involves operating the system typically for a period of approximately 100 hours at high temperature conditions. Experience has shown that if a chip is apt to fail, it generally fails under these conditions within the 100 hour time period. The conventional approach to testing chips is to first test the chip at the probe station, recognizing deficiencies in the number of probes and in speed. The chips which pass these tests are packaged. In high reliability systems, the packaged chips are burned-in under power. After burn-in, the package chips are tested again to determine proper functionality. The packaged chips are then interconnected on a printed circuit board to form the final system. Because of size and speed constraints, it is desirable to incorporate several chips in the same package. This complicates burn-in because one failed chip in a package requires that the whole package, including all the good chips, be discarded. The high density interconnect system disclosed herein uses an overlay layer to provide a method for directly connecting a large number of chips within the same package. The invention disclosed herein provides a method for the complete test and burn-in of the chip as well as a practical method for partitioning the system into manageable blocks which are easily tested. In addition, in an alternate configuration in which the test layer is added after the overlay layers have been interconnected, a removable overlay layer can be used to provide a multiplicity of connections throughout the rest of the system for the purpose of system testing and debugging during and after burn-in. This approach provides the rough equivalence of a "bed of nails" test fixture which is typically used for printed circuit boards but on a pitch of 1 mil rather than a pitch of 50 mils.

SUMMARY OF THE INVENTION

In a preferred embodiment of the present invention, an integrated circuit chip package comprises a substrate together with a plurality of integrated circuit chips affixed to the substrate. The integrated circuit chips have interconnect pads thereon for connections to other chips or to different parts of the same chip. A polymer film overlay is disposed over the chips and the substrate. The film possesses apertures aligned with at least some of the interconnect pads. The polymer film also contains a metallization pattern disposed on the film and operating to connect select interconnect pads. Most importantly, for the present invention, the package also includes at least one test chip disposed on the substrate and being operable to test at least one other of the chips on the substrate.

In accordance with another embodiment of the present invention, a method for producing integrated circuit chip packages begins by affixing a plurality of integrated circuit chips to a substrate. The integrated circuit chips possess interconnect pads, as described above. At least one test integrated circuit chip is also disposed on the substrate. The test chip includes means thereon for testably driving at least one of the other chips on the substrate. Then, a polymer film is disposed over the test chip and the other chip or chips. As above, the polymer film possesses a plurality of apertures, at least some of which are aligned with the interconnect pads, together with a layer of metallization for connecting selected pads on the test chip to selected pads on the other integrated circuit chips. It is noted that more than one test chip may be employed and that these test chips may include memory functions.

In yet another embodiment of the present invention, a method for producing integrated circuit chip packages includes a step of affixing a plurality of integrated circuit chips to a substrate. As above, the chips possess interconnect pads. Then an overlay layer is applied to the chips and to the substrates. The overlay layer includes a metallization pattern for connecting the chips in a first configuration. This configuration is then preferably tested after which the first overlay layer is removed and a second overlay layer is applied so as to connect the chips in a second configuration. In general, the second configuration is the one in which all parts of the system are connected for final use. It is noted that in this embodiment, the utilization of a test chip is not required.

Accordingly, it is an object of the present invention to provide a method for testing unpackaged interconnected circuits so as to cause minimum capacitive loading on the chips under test so as to thereby allow tests to be conducted at maximum speed.

It is also an object of the present invention to provide a method for testing which allows chips to operate in their final locations such that temperature and environmental conditions (such as electromagnetic interference, radio frequency interference and power supply variations) are all substantially identical to the final desired configuration.

It is yet another object of the present invention to provide a method for testing which allows long term burn-in of chips without tying up expensive test equipment.

It is a still further object of the present invention to provide a method for testing which allows the utilization of special chips, thereby eliminating the need for expensive high speed test equipment, allowing the combination of a multiplicity of chips to be tested at once and reducing the number of external connections or package pins required.

Another object of the present invention is to provide a method in which chips can be tested completely with a pad count which exceeds the capability of probe testing with pad sizes which are below the capacity of probe testing.

Yet another object of the present invention is to provide for functional testing of multiply interconnected chips.

It is a still further object of the present invention to provide multiple testing configurations by completely changing the interconnect wiring for one or more chips in the system.

Yet another object of the present invention is to provide a method of making a removable interconnection to a multiplicity of points in an integrated circuit chip system already connected by an overlay interconnect method, thereby allowing for complete system test with minimal increase in external probe, pins and drivers.

Lastly, but not limited hereto, it is an object of the present invention to effectively provide wafer scale integration packages without the concomitant reliability and yield problems associated therewith.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

A related patent application Ser. No. 240,367, filed Aug. 30, 1988, as a continuation of application Ser. No. 912,458, filed Sept. 26, 1986, describes a method and apparatus for applying a removable polymer overlay layer. A second related patent application Ser. No. 912,455, filed Sept. 26, 1986, now U.S. Pat. No. 4,714,516, issued Dec. 22, 1987, describes a preferable method for supplying the overlay layer with a pattern of apertures for connection to the above-described interconnect pads. A third related patent application Ser. No. 912,456, filed Sept. 26, 1986, now U.S. Pat. No. 4,783,695, issued Nov. 8, 1988, describes a method for providing a preferred form of metallization patterning over a polymer film. All three of these applications are hereby incorporated herein by reference. These applications are assigned to the same assignee as the present invention.

The first of the aforementioned patent applications in particular discloses a method involving few steps and using easy-to-use materials. The methods disclosed therein are generally more suitable for test layers since the test layer is easily processed and easily removed and since long term thermal and hydrolitic stability is not required.

Figure 1:
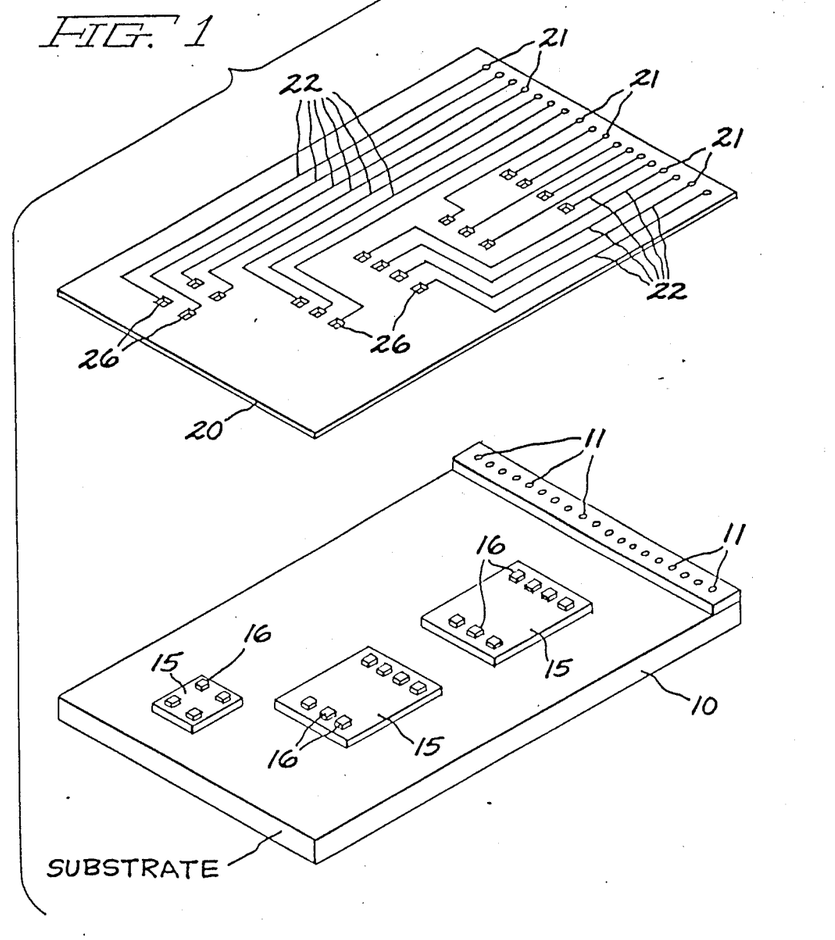
FIG. 1 is an exploded isometric view illustrating a multichip circuit with a test overlay layer.

FIG. 1 shows an exploded view of a multichip circuit with overlay layer 20 configured so as to test chips 15 on substrate 10. In a preferred embodiment of the present invention, chips 15 are affixed to substrate 10, as by bonding in place by conventional means using epoxy bonding, thermoplastic bonding, or eutectic die bonding. Polymer overlay layer 20 is applied by the following method. Two coats of a solution of methylmethacrylate in THF (tetrahydrofuran) are sprayed over chips 15 with interconnect pads 16. Each coat is dried at a temperature of approximately 150° C. for a period of about 5 minutes. A sheet of acetate film 1 mil in thickness is laminated to the top of the chips and to package pins 11. A vacuum pressure laminator is preferably employed. Details of a vacuum pressure laminator can be found in application Serial No. 240,367, filed Aug. 30, 1988, as a continuation of application Ser. No. 912,458, filed Sept. 26, 1986, which is referred to above. Preferable lamination conditions comprise a pressure of approximately 30 pounds per square inch at a temperature of about 120° C. for a period of about 3 minutes. The substrate is then cooled to 80° C. and removed from the laminator. Via holes over the appropriate chip pads and package pinout pads are fabricated using a focused laser according to the method outlined in U.S. Pat. No. 4,714,516, issued Dec. 22, 1987. Plasma etching is accomplished using somewhat less stringent conditions than required for high stability polymers. For example, one may employ an atmosphere of 30% $CF_4$ and 70% oxygen at a pressure of about 0.4 torr and at a power level of 200 watts for 6 minutes using a Branson IPC 2000 barrel etcher. Metallization is preferably provided by sputtering a 1,000 angstrom thick layer of titanium, followed by a layer of 1 micron thick copper. The metallization is preferably patterned by spraying or spinning a coating of photoresist on the copper surface, drying for about one half hour at approximately 90° C. and exposing the positive resist material with a scanned ultraviolet laser under control of computerized artwork. A preferable photoresist material includes Dynachem OFPR 800 photoresist. Details of a preferred laser exposure system are disclosed in U.S. Pat. No. 4,714,516, issued Dec. 22, 1987. After development of the photoresist, the desired metallization pattern is etched using an acid mix comprising 600 grams of nitric acid, 600 grams of sulfuric acid and 600 grams of $H_3PO_4$ in 1.5 liters of water to remove the copper layer, if present. A mixture comprising 1 part fluoroboric acid and 9 parts water is used to remove the titanium layer. The circuit is now ready for testing according to the metallization pattern illustrated in FIG. 1. The pattern of FIG. 1 is used to connect package pins 11 to pads 16 on each chip 15, as required for testing. All testing is conducted by applying signals to inputs through the package pins and observing the resultant outputs at the package pins, at least in the embodiment illustrated in FIG. 1. It is noted that via holes 26 are aligned with pads 16 on chips 15. It is also noted that vias 21 are aligned with package pins 11. It is further noted that metallization patterns 22 generally extend from via openings 21 to via openings 26 at least for the sample test configuration shown. This pattern may, however, vary over a wide range of patterns.

Figure 2:
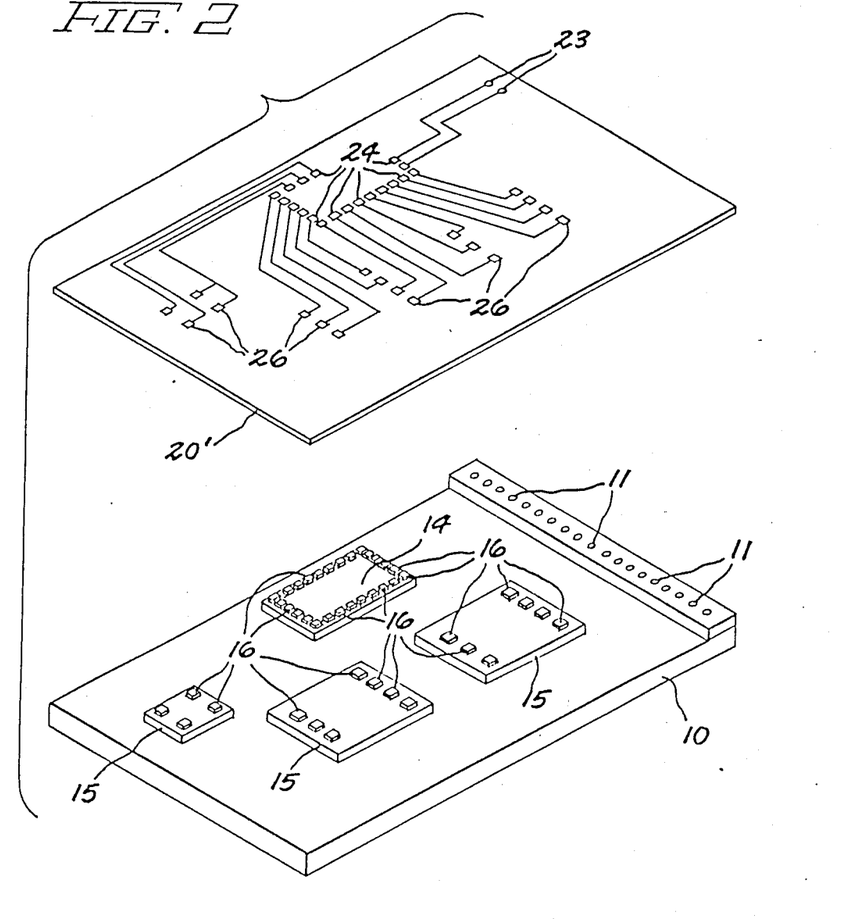
FIG. 2 is an exploded view similar to FIG. 1 but more particularly showing the utilization of a special test chip connected to the other chips in the circuit by means of a different overlay layer.

FIG. 2 illustrates an alternate embodiment of the present invention in which test chip 14 is used. Test chip 14 is connected to metallization patterns on overlay layer 20' by means of via openings 24. It is seen in FIG. 2 that overlay layer 20' now makes connections between chip pads 16 and test chip 14. It is noted that more than one test chip may be employed even though the figure illustrates only a single one being used. In the example illustrated in FIG. 2, only two connections 23 are shown as being required between the test chip and the package pins. It can be seen through the use of the test chip that packaging pins can be conserved.

Figure 3:
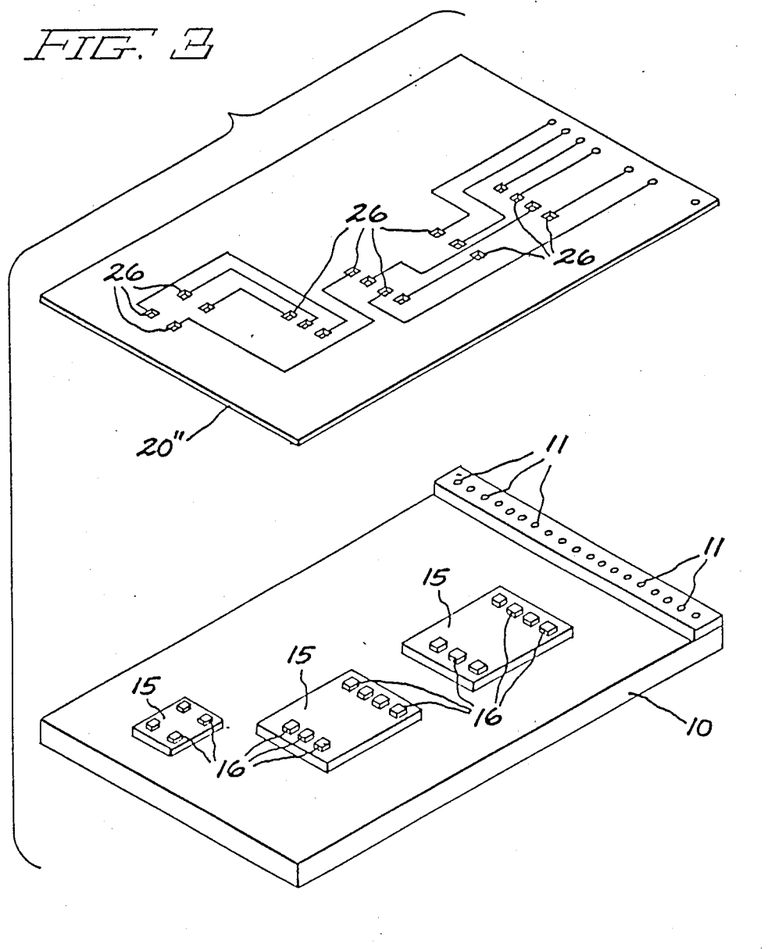
FIG. 3 is an exploded isometric view illustrating a multichip circuit package with operational overlay layer.

The configurations of FIGS. 1 or 2 may then be employed to test chips 15. Following the testing, overlay layers 20 or 20' may be removed. Defective chips may be removed or reconfigured or repositioned on the basis of test results obtained. Subsequently, an operational circuit overlay layer 20" may be applied to the chip configuration. As a result, the system illustrated in FIG. 3 may be produced. It is noted that the chief difference between FIG. 1 and FIG. 3 is the particular metallization pattern employed.

Figure 4A:
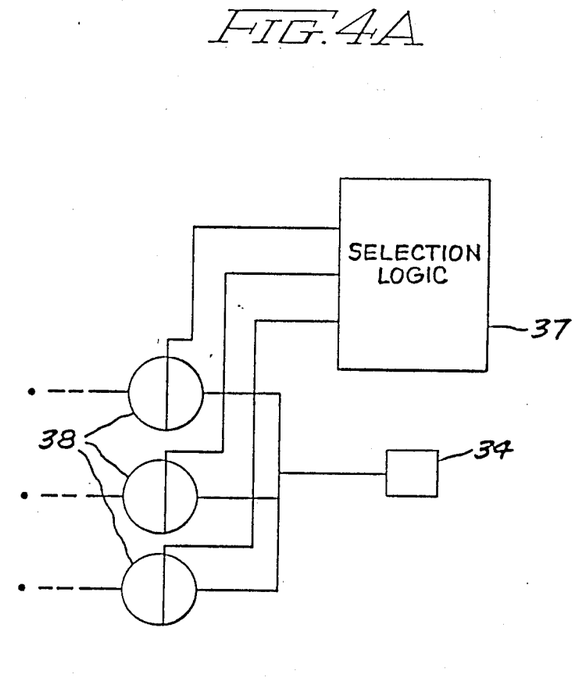
FIG. 4A illustrates means to probe internal test points with a reduced number of external pins.
Figure 4B:
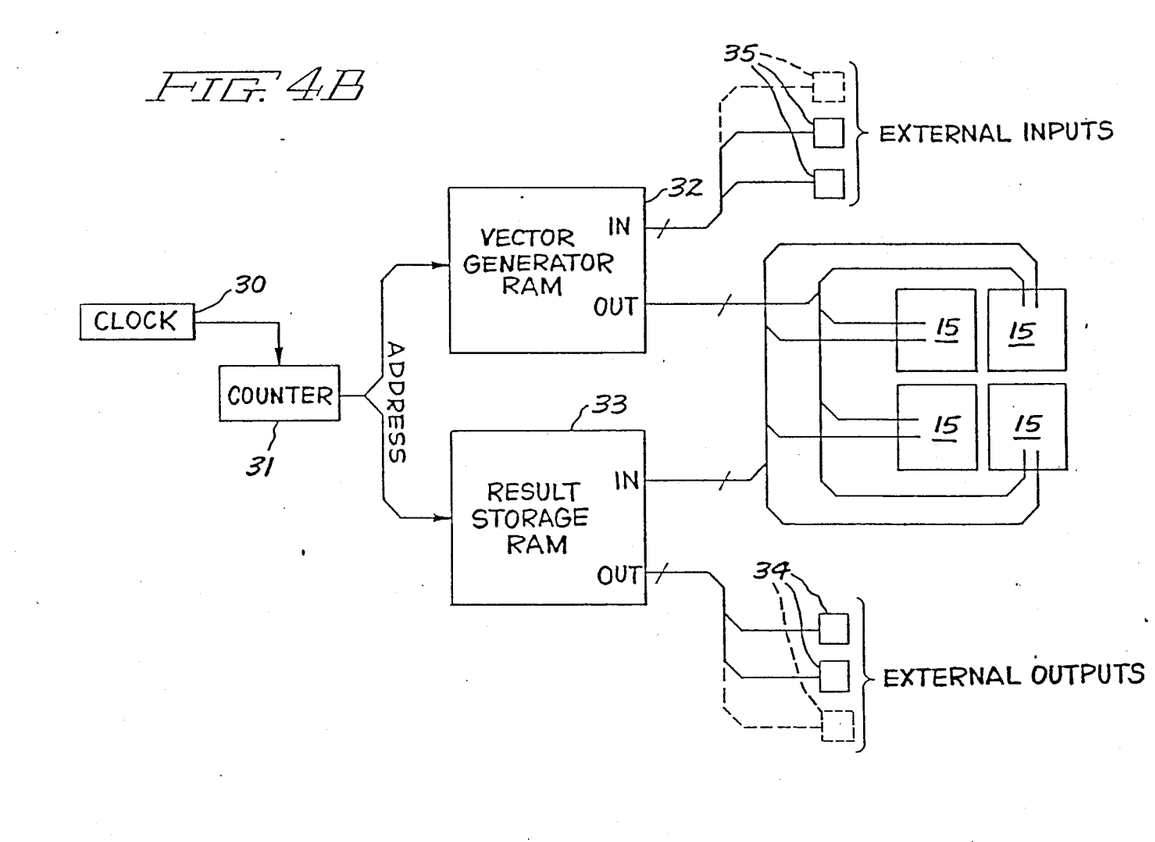
FIG. 4B is a schematic diagram illustrating the use of memory means to supply test vectors and to store test results on a packaged substrate assembly.
Figure 4C:
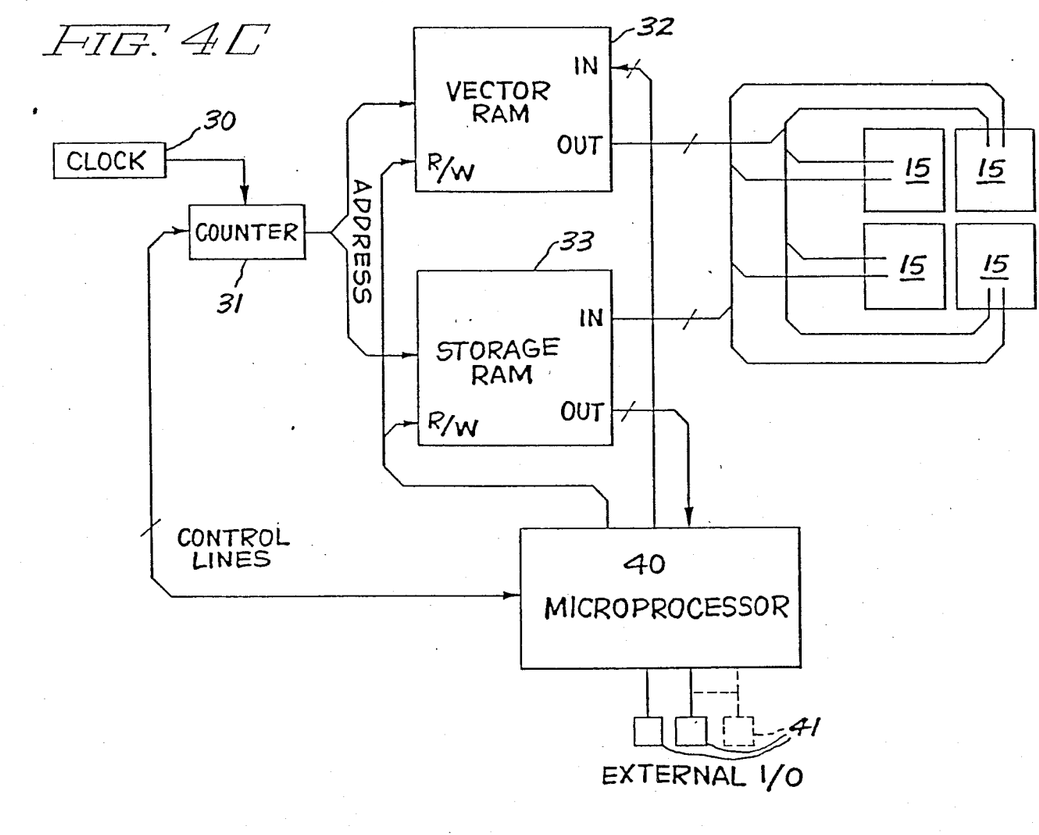
FIG. 4C is a schematic diagram similar to FIG. 4B more particularly illustrating the utilization of a microcomputer chip to compute test vectors and to evaluate test results.

FIGS. 4A, 4B and 4C show three alternate implementations of test chips. In all cases, these configurations consist of circuits and technologies well known to those skilled in the art.

FIG. 4A illustrates an array of three transmission gates 38 (typically in CMOS technology). One of the three transmission gates can be selected by selection logic 37. Under control of the test apparatus, the data selector applies the appropriate signal voltages to transmission gates 38 to turn one of the three gates on and to connect external pad 34 to one of three or more possible internal connection points. It is clear that a number of internal connection points can be multiplexed to one outside pin by this method. The very high density interconnect capability afforded by the overlay layer allows this method to act as a multiprobe connection system.

FIG. 4B illustrates an alternate embodiment of the present invention in which memory means 32, such as a random access memory, is employed as a vector generator to supply test vectors to the inputs of a chip or group of chips 15 under test. The output of the chip or group of chips is stored in second memory means 33 also typically comprising a random access memory. Counter 31 driven by clock 30 provides sequential addresses to sequence the output of test vectors and the storage of test results. This system can be run at very high speed, limited only by the speed of the memory means selected. The test vectors are supplied at a much more leisurely pace through external input pins 35. Inspection of the results is achieved in a much more leisurely pace by supplying the contents of memory means 33 to external pins 34. This shows an example of very high speed testing taking place through interconnections in the overlay layer with lower speed connections controlling the testing through external pins 35. It is noted that lines having a hash mark (/) denote multiple signal and/or control paths.

FIG. 4C shows a completely internal configuration for high speed testing. In this configuration, microprocessor 40 computes test vectors and supplies them to vector generation random access memory 32. When the requisite number of vectors are input to the memory, the memory is sequentially accessed by the associated counter and the output memory supplies the inputs to a chip or a group of chips 15 under test. The resultant outputs from the test are stored in second memory means 33. At the end of the cycle, microprocessor 40 reads the test results and compares them to computed results to determine if errors have occurred. In this configuration, the entire system can be tested over a long period of time under temperature and variations of other environmental conditions such as electromagnetic interference without any connection, other than power supply, to the outside world. Microprocessors can be used to store test results inconsistent with the expected results, thereby identifying the specific chip or chip group and the failure which occurred, even when the failure occurs on an intermittent basis. Microprocessor 40 is accessed via external pins 41.

When a given test is completed, the test layer is removed according to the following method. First, copper metallization is dissolved in a solution preferably comprising 600 grams of nitric acid, 600 grams sulfuric acid and 600 grams of $H_3PO_4$ in 1.5 liters of water for a period of about 1 minute. This removes copper, but does not attack either aluminum metallization typically present on the chip pads or titanium which is also preferably (though optionally) present as a barrier layer. Titanium is preferably removed by placement in a solution of fluoroboric acid for a period of about 15 seconds. The overlay polymer and adhesive can be removed in a solution of THF for a period of 2 minutes followed by immersion in another clean solution of THF for 1 minute. If a new test layer is to be applied, the test layer process as described above can be started immediately after a defective chip has been removed and a new one put in place. If the final operational overlay layer is to be implemented, a plasma etch to remove any residual polymer is also preferred. Etch conditions preferably include an atmosphere comprising 50% oxygen and 50% $CF_4$ at a total pressure of 0.4 torr for a period of about 2½ minutes in an IPC 2000 barrel etcher at a power level of approximately 300 watts. The final layer is then provided according to the process described in patent application Ser. No. 240,367, filed Aug. 30, 1988, as a continuation of application Ser. No. 912,458, filed Sept. 26, 1986. FIG. 3 illustrates an exploded view of tested chips on a substrate with an interconnection pattern for an operational circuit. Note that this pattern is completely different from the test patterns shown in FIGS. 1 or 2. Note also that the materials used for the final operational configuration preferably involve materials of long term thermal and hydrolitic stability such as KAPTON TM (supplied by Dupont de Nemours Company, Inc.) polyimide film. In addition, in the final operational configuration, the metallization used preferably comprises slightly thicker material to obviate any problems associated with electromigration or losses due to resistive paths.

Figure 5:
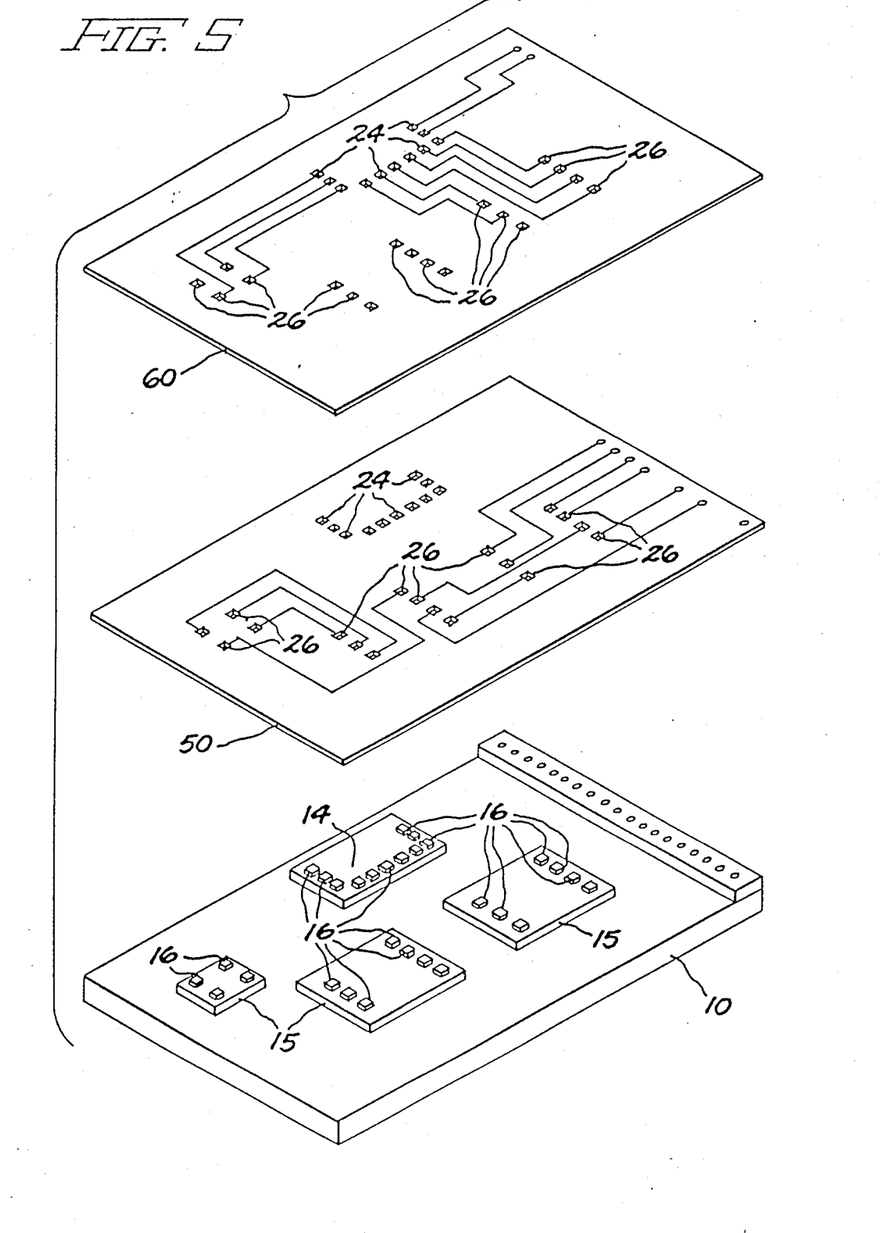
FIG. 5 is an exploded isometric view illustrating a multichip circuit assembly which simultaneously employs an operational circuit overlay layer and a test overlay layer.

An alternate approach involving the use of an overlay test layer is shown in an exploded view in FIG. 5. This is the same circuit as shown in FIG. 3 except that additional overlay layer 60 has been added to provide connections to the test chip or chips, and to the test pins of the package. Also note that operational circuit overlay layer 50 is similar to overlay layer 20" illustrated in FIG. 3 except for the presence of apertures 24 for connection to test chip 14. Test layer 60 can be added by spraying a solution of methylmethacrylate in THF and drying at a temperature of approximately 150° C. for a period of 5 minutes. Two such coats are generally required. At this point, via holes are fabricated to the connection points on the layer below by using focused laser energy as described in above-mentioned U.S. Pat. No. 4,714,516. Etch time in an oxygen plasma to clean out the apertures is relatively short since the layer is thin and since the material is highly susceptible to etching. Etch conditions of 200 watts for 4 minutes in an atmosphere comprising 30% $CF_4$ and 70% oxygen at a pressure of 0.4 Torr is sufficient. Metallization is preferably added by sputtering a layer of chrome which is approximately 1,000 angstroms thick, followed by sputtering of sufficient copper for conductivity, typically 1 micron in thickness. Metallization is patterned, as described above, by a photolithographic method using an etchant of nitric acid, sulfuric acid and $H_3PO_4$ in water, as above. This etchant etches the copper but not the chrome. Chrome is etched in a ceric sulfate solution operated at 60° C. When testing is complete, layer is easily removed by dissolving the copper in a copper etch solution. This etch attacks the copper, but does not attack the chrome layer. In this way, the underlying chrome layer protects the copper conductor of the underlying layer where it would be exposed at the interconnect points. The chrome is removed with a 25 second etch in the ceric sulfate sulfate solution. The test layer polymer dielectric can be removed in a solution of THF, followed by a second immersion in clean THF to remove any residue. The underlying KAPTON TM film of the operational interconnect overlay is totally uneffected by the THF solvent.

From the above, it should be appreciated that the method and configuration of the present invention fulfills all of the stated objectives. In particular, it is seen that a method is provided for testing integrated circuit chip subsystems to effectively provide wafer scale integration without its concomitant problems. Furthermore, it is seen that multi-chip integrated circuit systems can be constructed which would otherwise be untestable. It is also seen that the systems of the present invention can be tested in configurations substantially identical to their operating conditions in terms of capacitive loading, thermal environments and speed. It is also seen that the packaging method of the present invention permits the utilization of special test chips and thereby significantly reduces investment in special test systems. It is also seen that special testing can be done off line and that testing is accomplished at very high speeds. Accordingly, it is seen that the method and configuration of the present invention significantly advances the art of integrated circuit packaging.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for producing an electronic system in an integrated circuit chip package, said method comprising the steps of:
   disposing a plurality of integrated circuit chips on a substrate, said chips when properly interconnected comprising said electronic system and having interconnect pads thereon;
   disposing at least one test integrated circuit chip on said substrate, said test chip having interconnect pads thereon and including means for driving at least some chips of said plurality of chips; and
   disposing a polymer film over said test chip and at least one of said plurality of chips, said film having at least some apertures therein in alignment with said interconnect pads and said film having a metallization pattern thereon for connecting selected pads on said test chip to selected pads on said at least one of said plurality of chips.

2. The method of claim 1 in which said substrate material is selected from the group consisting of glass, metal, ceramic, plastic, silicon and composites.

3. The method of claim 1 in which said polymer film is selected from the group consisting of thermoplastic materials and thermoset materials.

4. The method of claim 1 in which said test chip is a microprocessor.

5. The method of claim 1 in which said test chip includes memory means for storing a set of test vectors.

6. The method of claim 5 in which said test chip includes memory means for storing test result data.

7. The method of claim 1 further including the step of operating said test chip so as to drive an interconnected configuration of said plurality of chips including the steps of:
   removing said polymer film and said metallization pattern;
   applying a second polymer film over said plurality of chips;
   providing apertures in said second polymer film; and
   forming a second metallization pattern on said second film for connecting said chips in a second configuration.

8. The method of claim 7 further including the step of removing said polymer film and reapplying a second polymer film having aperture and metallization patterns thereon for connecting said chips in a second configuration.

9. The method of claim 8 in which the locations of said apertures in said second polymer film and said second metallization pattern are determined in response to results obtained from said step of operating said test chip.

10. A method for producing an electronic system comprised of integrated chips in a package, said method comprising the steps of:
    disposing a plurality of integrated circuit chips on a substrate, said chips when properly interconnected comprising said electronic system and having interconnect pads thereof;
    disposing at least one test integrated circuit chip on said substrate, said test chip having interconnect pads thereon and including means for driving at least one of said plurality of chips;
    disposing a polymer film over said test chip and said plurality of chips, said film having at least some apertures therein in alignment with said interconnect pads and said film having a first metallization pattern thereon for interconnecting selected pads on said plurality of chips;
    disposing a second polymer film over said first polymer film and said first metallization pattern, said second polymer film having at least some apertures therein in alignment with connection points thereunder and said second polymer film having a second metallization pattern thereon for connecting selected pads on said plurality of chips, one of said first and second metallization patterns functioning to provide connections to said test chip for test functions and the other of said first and second metallization patterns functioning to provide connections for achieving operational functionality.

11. The method recited in claim 10 further comprising the step of:
    removing said second metallization pattern and said second polymer film by a process which does not impair the usability of any of (1) said chips, (2) said first polymer film and (3) said first metallization pattern.

12. The method recited in claim 10 wherein said first metallization pattern provides connections for achieving operability and said second metallization pattern provides connections to said test chips and said method further comprising the steps of:
    testing said electronic system with said test chip; and
    removing said second metallization pattern after the testing step by a process which does not impair the usability of any of (1) said chips, (2) said first polymer film and (3) said first metallization pattern.

13. A method for producing an electronic system in an integrated circuit chip package, said method comprising the steps of:
    disposing a plurality of integrated circuit chips on a substrate, said chips when properly connected comprising said electronic system and having interconnect pads thereof;
    disposing a dielectric overlay layer over said chips, said layer having at least some apertures therein in alignment with at least some of said interconnect pads and having a first metallization pattern thereon for connecting said chips in a first configuration;
    testing at least one of said chips;
    removing said overlay layer and said metallization; and
    applying a second dielectric overlay layer over said chips and said substrate, said second overlay layer having at least some apertures therein in alignment with at least some of said interconnect pads, said second overlay layer having a second metallization pattern thereon for connecting said chips in a second configuration.

14. The method of claim 13 further including the step of testing said integrated circuit chips while connected in said first configuration.

* * * * *